(12) United States Patent
Mukaiyama et al.

(10) Patent No.: US 9,887,684 B2
(45) Date of Patent: Feb. 6, 2018

(54) ISOLATOR

(71) Applicant: Murata Manufacturing Co., Ltd., Nagaokakyo-shi, Kyoto-fu (JP)

(72) Inventors: Kazutaka Mukaiyama, Nagaokakyo (JP); Kenji Saito, Nagaokakyo (JP); Takaya Wada, Nagaokakyo (JP); Reiji Nakajima, Nagaokakyo (JP); Shingo Yanagihara, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 187 days.

(21) Appl. No.: 15/018,926

(22) Filed: Feb. 9, 2016

(65) Prior Publication Data
US 2016/0173056 A1    Jun. 16, 2016

Related U.S. Application Data

(63) Continuation of application No. PCT/JP2014/070003, filed on Jul. 30, 2014.

(30) Foreign Application Priority Data

Sep. 2, 2013   (JP) ................... 2013-180897

(51) Int. Cl.
*H01P 1/36*   (2006.01)
*H03H 7/52*   (2006.01)
(Continued)

(52) U.S. Cl.
CPC ............... *H03H 7/52* (2013.01); *H01P 1/36* (2013.01); *H04B 1/04* (2013.01); *H04B 1/3827* (2013.01)

(58) Field of Classification Search
CPC ...... H01P 1/32; H01P 1/36; H01P 1/38; H01P 1/383
(Continued)

(56) References Cited

U.S. PATENT DOCUMENTS 5,752,182 A     5/1998 Nakatsuka et al.
2011/0233036 A1  9/2011 Takeda et al.
(Continued)

FOREIGN PATENT DOCUMENTS

EP   0 683 519 A2   11/1995
JP   8-32018 A       2/1996
(Continued)

OTHER PUBLICATIONS

Official Communication issued in International Application PCT/JP2014/070003, dated Oct. 21, 2014.

*Primary Examiner* — Stephen E Jones
(74) *Attorney, Agent, or Firm* — Keating & Bennett, LLP

(57) ABSTRACT

An isolator includes a core isolator, a main substrate and a circuit-defining section. The main substrate includes a first wiring portion, a second wiring portion and a third wiring portion and has the core isolator and the circuit-defining section mounted thereon. An input port of the core isolator is connected to the first wiring portion. An output port of the core isolator is connected to the second wiring portion. A ground port of the core isolator is connected to the third wiring portion. In the circuit-defining section, a conductor pattern includes a capacitor that is connected in parallel with the core isolator via the first wiring portion and the second wiring portion, and an impedance element that is connected to at least either of the first wiring portion and the second wiring portion.

18 Claims, 8 Drawing Sheets

(51) Int. Cl.
*H04B 1/04* (2006.01)
*H04B 1/3827* (2015.01)

(58) Field of Classification Search
USPC .................................................. 333/1.1, 24.2
See application file for complete search history.

(56) References Cited

U.S. PATENT DOCUMENTS

| | | | |
|---|---|---|---|
| 2014/0080431 A1 | 3/2014 | Wada et al. | |
| 2014/0340166 A1* | 11/2014 | Wada | H01P 1/36 333/1.1 |
| 2015/0109066 A1* | 4/2015 | Yamada | H01P 1/36 333/1.1 |

FOREIGN PATENT DOCUMENTS

| | | |
|---|---|---|
| JP | 2003-218215 A | 7/2003 |
| JP | 2011-13756 A | 1/2011 |
| WO | 2012/172882 A1 | 12/2012 |

\* cited by examiner

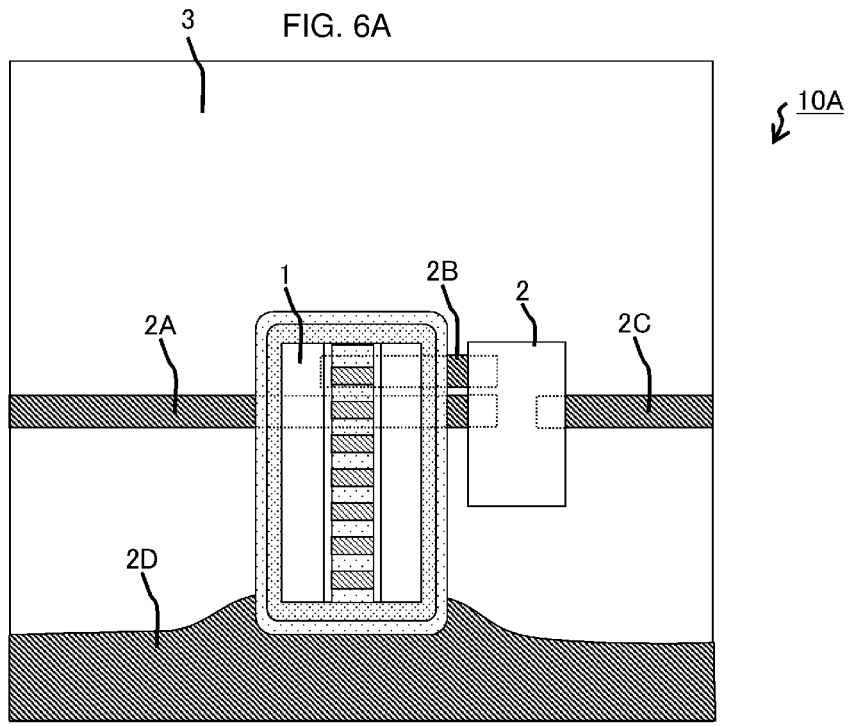
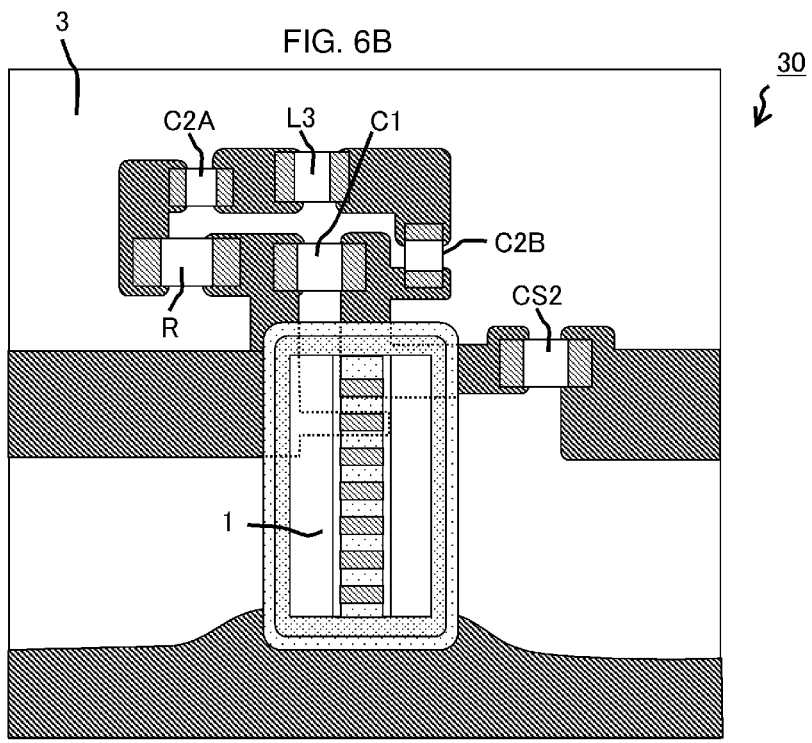

Frequency ( 824MHz to 915MHz )

m3
824MHz
IMPEDANCE=
20.0+j42.2 m4
915MHz
IMPEDANCE=
28.8+j46.3

Frequency ( 824MHz to 915MHz )

m3
824MHz
IMPEDANCE=
19.0+j39.5 m4
915MHz
IMPEDANCE=
27.6+j44.0

ISOLATOR

BACKGROUND OF THE INVENTION

1. Field of the Invention

The present invention relates to an isolator that transmits a high-frequency signal in only a specific direction.

2. Description of the Related Art

An isolator that has an unbalanced input port and an unbalanced output port includes a core isolator. The core isolator includes, for example, a first central conductor that connects an input port and an output port to each other, a second central conductor that connects the input port and a ground port to each other, a soft magnetic material core that is provided on a surface thereof with the first central conductor and the second central conductor so as to cross each other while being insulated from each other, and a permanent magnet that applies magnetic flux to a portion where the first central conductor and the second central conductor cross each other.

The isolator needs to be provided with a plurality of impedance elements in addition to the core isolator, and the core isolator is mounted on a circuit board provided with the plurality of impedance elements. As the impedance elements, which constitute the isolator in addition to the core isolator, for example, a capacitor that is connected between the input port and the output port of the core isolator, a resistor that is connected between the input port and the output port of the core isolator, a capacitor and an inductor forming an LC series circuit that is connected between the input port and the output port of the core isolator along with the resistor, and an impedance-adjusting capacitor that is connected between the input port or the output port of the core isolator and an external connection terminal are provided (for example, refer to Japanese Unexamined Patent Application Publication No. 2011-13756).

Conventionally, the plurality of impedance elements of such an isolator are formed separately as chip components. Since arrangement gaps of a certain size or more are provided between the plurality of chip components mounted on a main substrate, if there is a large number of such chip components, in addition to the main substrate becoming larger, connection wiring lines that connect the individual chip components to each other become longer and parasitic components generated by the connection wiring lines cause various problems to arise. For example, a frequency band (isolation band) in which propagation of a signal from the output port to the input port of the isolator is suppressed becomes narrower as a result of a parasitic inductance becoming larger. In addition, passage loss of a signal in the isolator becomes larger as a result of a parasitic resistance becoming larger. Furthermore, the input impedance of the isolator becomes higher as a result of the parasitic inductance and parasitic capacitance becoming larger.

SUMMARY OF THE INVENTION

Accordingly, preferred embodiments of the present invention provide an isolator in which a main substrate on which a core isolator is mounted is significantly reduced in size and in which connection wiring lines that connect chip components to each other are significantly reduced in length.

An isolator according to a preferred embodiment of the present invention includes a core isolator, a main substrate and a circuit-defining section. The core isolator includes a permanent magnet, a soft magnetic material core to which a direct-current magnetic field is applied from the permanent magnet, and a first central conductor and a second central conductor that oppose each other while being insulated from each other on a surface of the soft magnetic material core. The main substrate includes an input connection portion, an output connection portion and a ground connection portion, and has the core isolator mounted thereon. One end of the first central conductor and one end of the second central conductor are connected to the input connection portion. Another end of the first central conductor is connected to the output connection portion. Another end of the second central conductor is connected to the ground connection portion. In the circuit-defining section, a conductor pattern is provided to include at least a capacitor that is connected in parallel with the first central conductor via the input connection portion and the output connection portion, and an impedance element that is connected to at least either of the input connection portion and the output connection portion.

Thus, the number of components mounted on the main substrate is significantly reduced and the main substrate is able to have a significantly reduced size compared with the case where the plurality of impedance elements are mounted on the main substrate as individual components. In addition, by including the capacitor and the impedance element in the circuit-defining section, the lengths of connection wiring lines between the capacitor and the impedance element are able to be significantly reduced and parasitic components generated by the connection wiring lines are able to be significantly reduced or prevented. Moreover, the occurrence of mounting failures, mounting deviations and manufacturing errors is significantly reduced or prevented for the capacitor and the impedance element and the accuracy of the values of these components is increased. Consequently, as a result of the accuracy of the capacitance being increased and it being possible to significantly reduce or prevent parasitic components generated by the connection wiring lines (particularly the parasitic inductance), the occurrence of a defect in which a large frequency shift occurs for a frequency band in which propagation of a signal from the output port to the input port of the core isolator is significantly reduced or prevented (isolation band) and the occurrence that the isolation band is shifted from the desired frequency band is significantly reduced or prevented.

It is preferable that the circuit-defining section further include a semiconductor thin film on a surface on which the conductor pattern is provided. Thus, the conductor pattern is able to be formed with high accuracy on the semiconductor thin film and the lengths of the connection wiring lines in the circuit-defining section are able to be further reduced. In addition, high form accuracy is achieved for the conductor pattern and variations in the isolation characteristics are significantly reduced or prevented.

It is preferable that the circuit-defining section further include a support substrate on which the semiconductor thin film is formed and bumps that are provided on the semiconductor thin film and connect the conductor pattern to the input connection portion and the output connection portion. Thus, the lengths of connection wiring lines that connect the conductor pattern of the circuit-defining section to connection portions of the main substrate are able to be significantly reduced even when the semiconductor thin film is supported by a support substrate.

It is preferable that the support substrate be an insulator substrate. Since an insulator substrate such as a glass or GaAs substrate has a high insulation resistance compared to a semiconductor substrate such as a Si substrate which would be typically used as the support substrate of the semiconductor thin film, passage loss of a signal in the circuit-defining section is able to be significantly reduced.

It is preferable that the circuit-defining section be arranged such that a bump that is connected to the input connection portion and a bump that is connected to the output connection portion be adjacent to each other and that the conductor pattern that defines the capacitor be arranged between the bumps. Thus, connection wiring lines between the first central conductor and the capacitor are able to be significantly shortened, parasitic components generated by the connection wiring lines are greatly reduced or prevented, and as a result better isolator characteristics are realized.

According to preferred embodiments of the present invention, a main substrate is significantly reduced in size. In addition, the lengths of connection wiring lines that connect impedance elements provided on a circuit-defining board to each other are significantly reduced, thus significantly reducing parasitic components generated by the connection wiring lines. Thus, passage loss of the isolator is significantly reduced by suppressing parasitic resistances, and the input impedance of the isolator is significantly reduced by suppressing parasitic inductances and parasitic capacitances.

In addition, along with the parasitic components being suppressed, the accuracy of the capacitance of the capacitor provided on the circuit-defining board is increased and therefore the occurrence of a defect in which a large frequency shift occurs for the isolation band of the core isolator and the isolation band is shifted from the desired frequency band is significantly reduced or prevented.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 6A and 6B are plan views illustrating isolators according to an example of a preferred embodiment of the present invention and a comparative example, respectively.

DETAILED DESCRIPTION OF THE PREFERRED EMBODIMENTS

Figure 1:
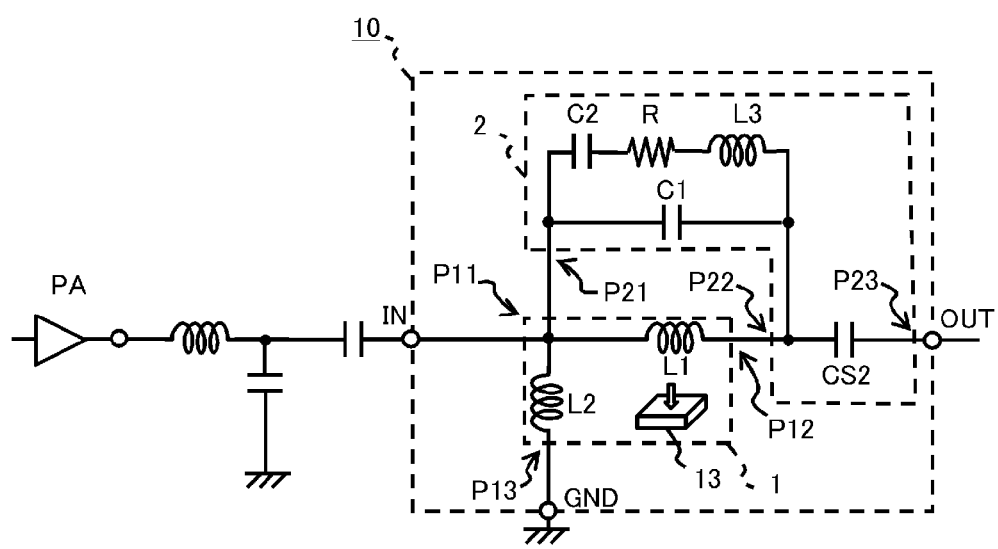
FIG. 1 is an equivalent circuit diagram of an isolator according to a preferred embodiment of the present invention.

Hereafter, isolators according to preferred embodiments of the present invention will be described while referring to the drawings.

FIG. 1 is an equivalent circuit diagram of an isolator 10 according to a first preferred embodiment of the present invention.

The isolator 10 preferably is to be incorporated into the transmission circuit of a cellular phone, for example, and is equipped with an external connection terminal IN that is connected to a transmission power amplifier PA via a matching circuit, an external connection terminal OUT that is connected to an antenna via a duplexer or the like, and an external connection terminal GND that is connected to ground. The isolator 10 further includes a core isolator 1 and a circuit-defining section 2.

Although the structure of the core isolator 1 will be described in detail later, the core isolator 1 preferably has a structure in which a first central conductor 17 and a second central conductor 18 are arranged on the surfaces of a soft magnetic material core 16 so as to cross each other while being insulated from each other (refer to FIGS. 4A and 4B), a direct current magnetic field is applied from permanent magnets 11 and 12 to the portion where the first central conductor 17 and the second central conductor 18 cross each other (refer to FIG. 3), and the first central conductor 17 and the second central conductor 18 are magnetically coupled with each other.

As an equivalent circuit, the core isolator 1 includes an inductor L1 defined by the first central conductor 17 and an inductor L2 defined by the second central conductor 18. One end of the inductor L1 (first central conductor 17) and one end of the inductor L2 (second central conductor 18) are connected to each other and define an input port P11 of the core isolator 1. The other end of the inductor L1 defines an output port P12 of the core isolator 1. The other end of the inductor L2 defines a ground port P13.

The input port P11 of the core isolator 1 is connected to the external connection terminal IN of the isolator 10. The output port P12 of the core isolator 1 is connected to the external connection terminal OUT of the isolator 10 via an impedance-adjusting capacitor CS2, which will be described later. The ground port P13 of the core isolator 1 is connected to the external connection terminal GND of the isolator 10.

Although the structure of the circuit-defining section 2 will be described in detail later, the circuit-defining section 2 is equipped with an input port P21, a relay port P22 and an output port P23. The input port P21 is connected to the external connection terminal IN of the isolator 10 and the input port P11 of the core isolator 1. The relay port P22 is connected to the output port P12 of the core isolator 1. The output port P23 is connected to the external connection terminal OUT of the isolator 10. In addition, the circuit-defining section 2 further includes capacitors C1, C2 and CS2, a resistor R and an inductor L3. The capacitor C1 is provided between the input port P21 and the relay port P22 and is connected in parallel with the inductor L1 of the core isolator 1. The capacitor C2, the resistor R and the inductor L3 are connected in series with each other, are provided in parallel with the capacitor C1 and between the input port P21 and the relay port P22, and are connected in parallel with the inductor L1 of the core isolator 1. The capacitor CS2 is an impedance-adjusting capacitor and is provided between the relay port P22 and the output port P23.

Figure 2:
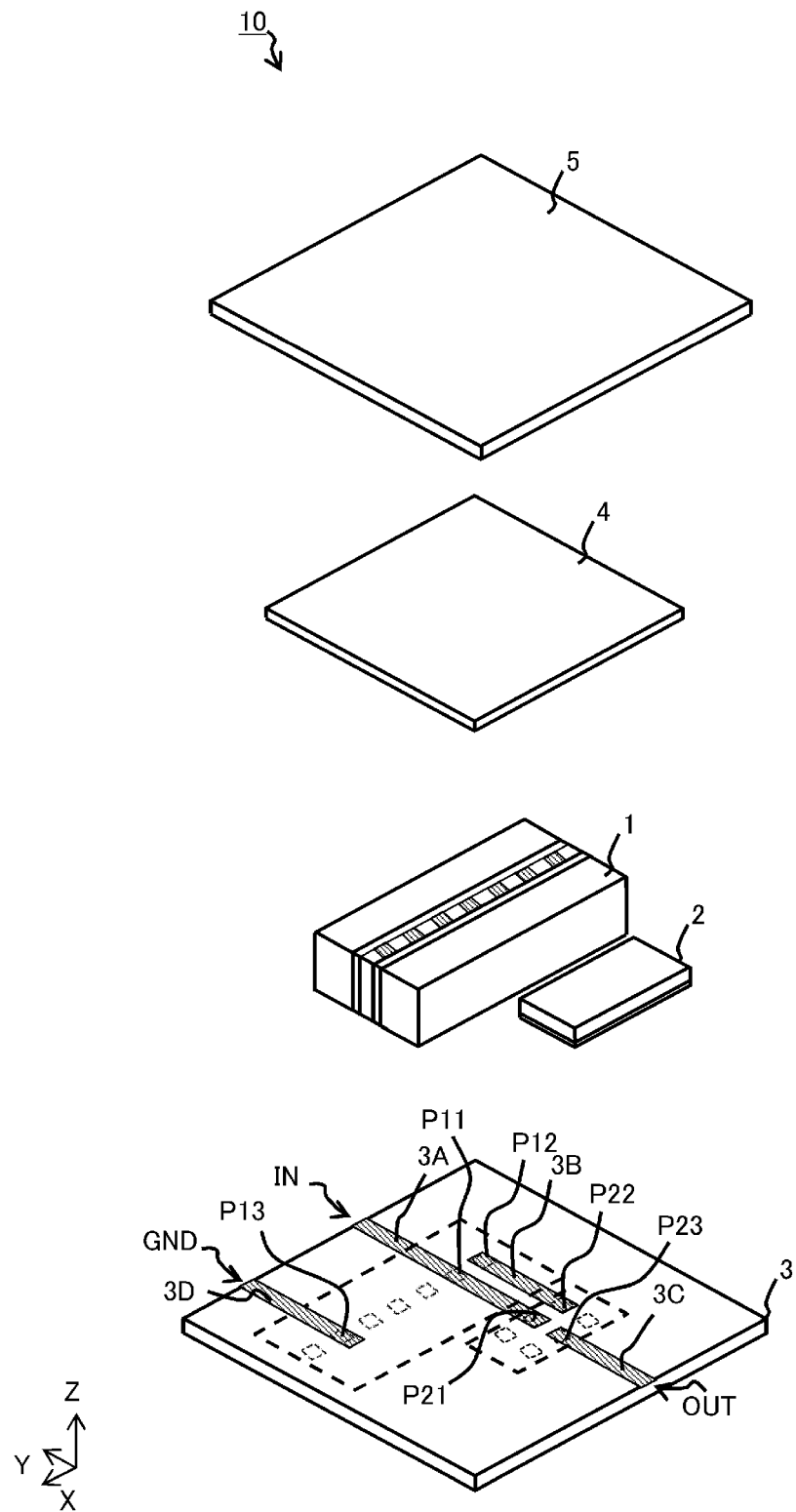
FIG. 2 is an exploded perspective view of an isolator according to a preferred embodiment of the present invention.

FIG. 2 is an exploded perspective view of the isolator 10 according to the first preferred embodiment. In the drawings referred to hereafter, diagonally shaded portions represent conductors.

The isolator 10 includes the core isolator 1, the circuit-defining section 2, a main substrate 3, an adhesive sheet (dielectric sheet) 4 and a flat-plate yoke 5.

The core isolator 1 and the circuit-defining section 2 are surface mounted on the main substrate 3. The flat-plate yoke 5 has an electromagnetic shield function and is joined to the upper surface of the core isolator 1 via the adhesive sheet 4. Functions of the flat-plate yoke 5 include, for example, suppressing magnetic leakage from the core isolator 1, suppressing leakage of high-frequency electromagnetic fields, suppressing the effect of magnetism from the outside and providing a location at which to pick up the isolator 10 with a vacuum nozzle when mounting the isolator 10 on a substrate, which is not illustrated, using a chip mounter or the like. Although the flat-plate yoke 5 does not necessarily have to be grounded, the flat-plate yoke 5 may be grounded with solder or a conductive adhesive and the electromagnetic shielding effect will be improved if the flat-plate yoke 5 is grounded.

The main substrate 3 includes wiring portions 3A, 3B, 3C and 3D. The wiring portions 3A, 3B, 3C and 3D are provided on the upper surface of the main substrate 3. The wiring portion 3A extends from the external connection terminal IN to a position where the input port P21 of the circuit-defining section 2 will be mounted while passing through a position where the input port P11 of the core isolator 1 will be mounted. The wiring portion 3B extends from a position where the output port P12 of the core isolator 1 will be mounted to a position where the relay port P22 of the circuit-defining section 2 will be mounted. The wiring portion 3C extends from the external connection terminal OUT to position where the output port P23 of the circuit-defining section 2 will be mounted. The wiring portion 3D extends from the external connection terminal GND to a position where the ground port P13 of the core isolator 1 will be mounted. The wiring portion 3A is an input connection portion to which the input port P11 of the core isolator 1 is to be connected. The wiring portion 3B is an output connection portion to which the output port P12 of the core isolator 1 is to be connected. The wiring portion 3D is a ground connection portion to which the ground port P13 of the core isolator 1 is to be connected.

Figure 3:
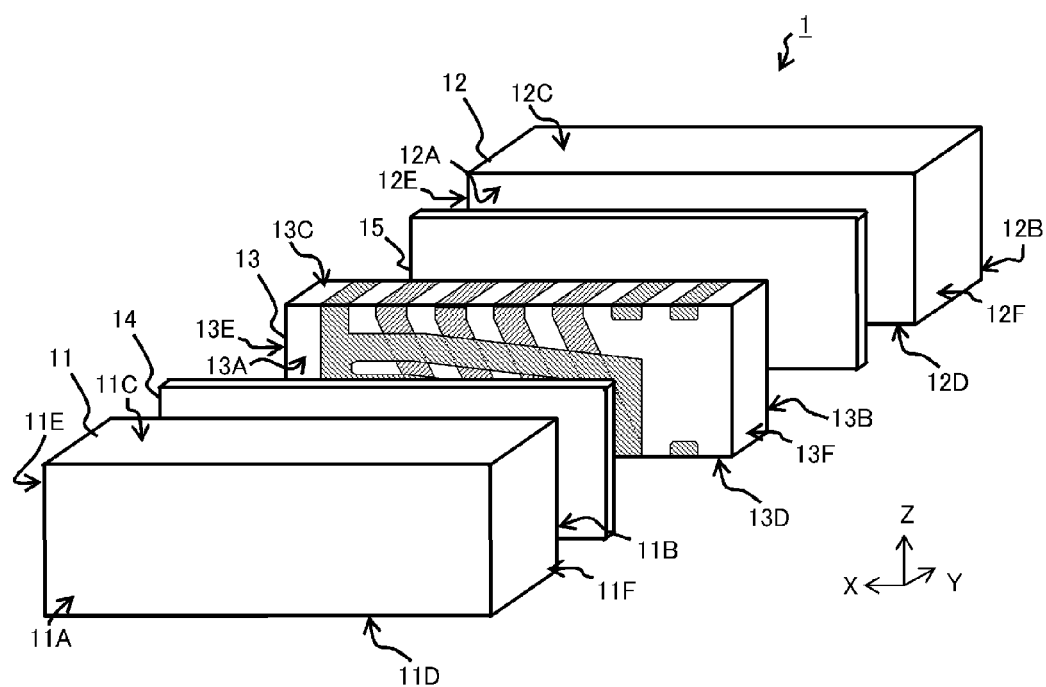
FIG. 3 is an exploded perspective view of a core isolator according to a preferred embodiment of the present invention.

FIG. 3 is an exploded perspective view of the core isolator 1. The core isolator 1 preferably has a rectangular or substantially rectangular parallelepiped shape on the whole and includes the permanent magnets 11 and 12, a central-conductor-defining portion 13, and adhesive portions 14 and 15.

The central-conductor-defining portion 13 preferably is rectangular or substantially rectangular parallelepiped shaped and includes a front main surface 13A, a rear main surface 13B, an upper surface 13C, a lower surface 13D, a left end surface 13E and a right end surface 13F. The boundaries between the front main surface 13A, the upper surface 13C, the rear main surface 13B and the lower surface 13D are long edges and the boundaries between the left end surface 13E and the right end surface 13F and the front main surface 13A, the upper surface 13C, the rear main surface 13B and the lower surface 13D are short edges.

The permanent magnet 11 preferably is rectangular or substantially rectangular parallelepiped shaped and includes front and rear magnetic pole surfaces 11A and 11B, an upper surface 11C, a lower surface 11D, a left end surface 11E and a right end surface 11F. Boundaries between the magnetic pole surface 11A, the upper surface 11C, the magnetic pole surface 11B and the lower surface 11D are long edges and boundaries between the left end surface 11E and the right end surface 11F, and the magnetic pole surface 11A, the upper surface 11C, the magnetic pole surface 11B and the lower surface 11D are short edges.

The permanent magnet 12 preferably is rectangular or substantially rectangular parallelepiped shaped and includes front and rear magnetic pole surfaces 12A and 12B, an upper surface 12C, a lower surface 12D, a left end surface 12E and a right end surface 12F. Boundaries between the magnetic pole surface 12A, the upper surface 12C, the magnetic pole surface 12B and the lower surface 12D are long edges and boundaries between the left end surface 12E and the right end surface 12F, and the magnetic pole surface 12A, the upper surface 12C, the magnetic pole surface 12B and the lower surface 12D are short edges.

The magnetic pole surfaces 11A and 12A of the permanent magnets 11 and 12 are an N pole or an S pole and have the same magnetic polarity as each other. The magnetic pole surfaces 11B and 12B of the permanent magnets 11 and 12 are an S pole or an N pole and have the same magnetic polarity as each other and the opposite magnetic polarity to the magnetic pole surfaces 11A and 12A. Therefore, the permanent magnet 11 and the permanent magnet 12 apply a magnetostatic field that is parallel or substantially parallel to the Y axis between the front main surface 13A and the rear main surface 13B of the central-conductor-defining portion 13. The permanent magnets 11 and 12 each preferably include a hard magnetic material referred to as a La—Co-substituted ferrite magnet or a strontium-based, barium-based, neodymium-based hard magnetic material, for example.

The permanent magnet 11 and the central-conductor-defining portion 13 are arranged such that the magnetic pole surface 11B and the front main surface 13A oppose each other. The permanent magnet 12 and the central-conductor-defining portion 13 are arranged such that the magnetic pole surface 12A and the rear main surface 13B oppose each other. The magnetic pole surface 11B of the permanent magnet 11 is joined to the front main surface 13A of the central-conductor-defining portion 13 via the adhesive portion 14. The magnetic pole surface 12A of the permanent magnet 12 is joined to the rear main surface 13B of the central-conductor-defining portion 13 via the adhesive portion 15. The adhesive portions 14 and 15 include a one-component heat-curable epoxy-based adhesive agent, for example.

Figure 4A:
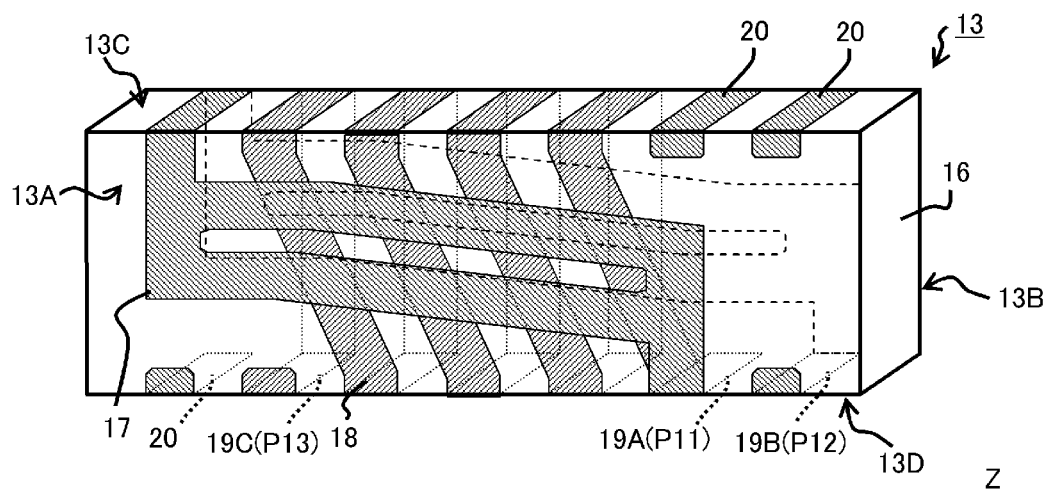
FIGS. 4A and 4B are perspective views illustrating a soft magnetic material core and central conductors according to a preferred embodiment of the present invention.
Figure 4B:
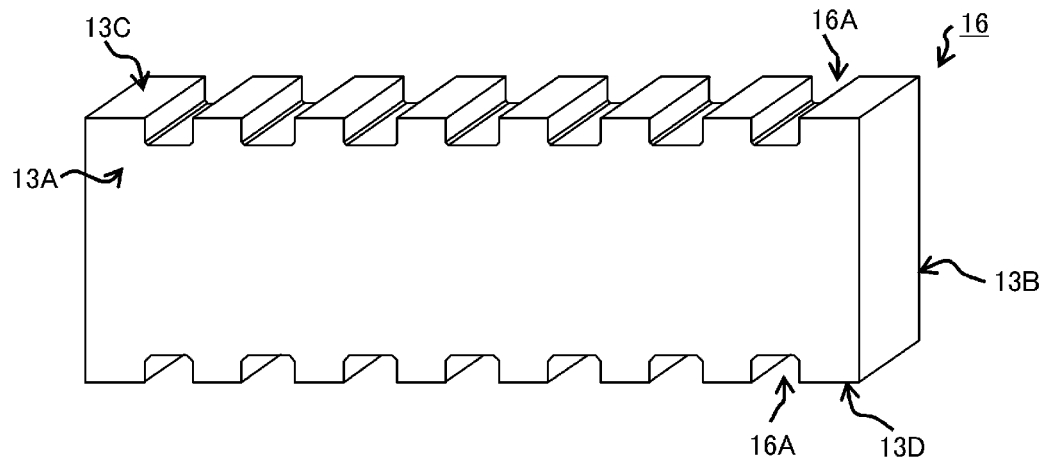

FIG. 4A is a perspective view of the central-conductor-defining portion 13. The central-conductor-defining portion 13 includes the soft magnetic material core 16. FIG. 4B is a perspective view of the soft magnetic material core 16.

The central-conductor-defining portion 13 includes the soft magnetic material core 16, the central conductors 17 and 18, connection electrodes 19A, 19B and 19C and dummy electrodes 20.

The soft magnetic material core 16 preferably has the shape of a flat plate and includes a soft magnetic core material such as a YIG-based ferrite or a CVG-based ferrite. The soft magnetic material core 16 is provided with a plurality of recesses 16A at regular intervals on the surfaces thereof that will become the upper surface 13C and the lower surface 13D of the central-conductor-defining portion 13. An electrode conductor is provided in each of the recesses 16A, and the electrode conductors define the dummy electrodes 20, portions of the central conductors 17 and 18, and the connection electrodes 19A, 19B and 19C. In addition, a conductor film that defines portions of the central conductors 17 and 18 is patterned on surfaces of the soft magnetic material core 16 that will become the front main surface 13A and the rear main surface 13B of the central-conductor-defining portion 13.

The connection electrode 19A is the input port P11, which is connected to the wiring portion 3A of the main substrate 3 described earlier. The connection electrode 19B is the output port P12, which is connected to the wiring portion 3B of the main substrate 3 described earlier. The connection electrode 19C is the ground port P13, which is connected to the wiring portion 3C of the main substrate 3 described earlier. The connection electrodes 19A, 19B and 19C are provided on the lower surface 13D of the central-conductor-defining portion 13. The dummy electrodes 20 are electrodes that are not connected to the central conductors and are provided on the lower surface 13D and the upper surface 13C of the central-conductor-defining portion 13.

The central conductor 17 is provided on the front main surface 13A, the rear main surface 13B, the upper surface 13C and the lower surface 13D of the central-conductor-defining portion 13 and is wound through one turn around the soft magnetic material core 16. Specifically, the central conductor 17 extends upward from the bottom right of the front main surface 13A and branches into two portions, extends toward the top left while being inclined at a relatively small angle with respect to the long edges, extends upward toward the top left of the front main surface 13A after merging into one piece, and then extends onto the upper surface 13C. Then, the central conductor 17 extends toward the rear of the upper surface 13C and extends onto the rear main surface 13B. The central conductor 17 is provided on the rear main surface 13B so as to branch into two portions so as to be superposed or substantially superposed with the front main surface 13A as viewed from above in a see-through state, and extends from the top left to the bottom right of the rear main surface 13B when viewed from the front main surface 13A. An end of the central conductor 17 on the front main surface 13A is connected to the connection electrode 19A located on the lower surface 13D. An end of the central conductor 17 on the rear main surface 13B is connected to the connection electrode 19B located on the lower surface 13D.

The central conductor 18 is provided on the front main surface 13A, the rear main surface 13B, the upper surface 13C and the lower surface 13D of the central-conductor-defining portion 13 and is wound through four turns around the soft magnetic material core 16 so as to be electrically insulated from the central conductor 17 via an insulating film, which is not illustrated. The insulating film, which insulates the central conductors 17 and 18 from each other, may be defined by a method such as printing, transference or photolithography as a dielectric thick film such as a glass or alumina film or a resin film such as a polyimide film.

Specifically, the central conductor 18 extends in an inclined manner at a relatively large angle with respect to the long edges from the bottom right of the front main surface 13A toward the top left while crossing the central conductor 17 and then extends onto the upper surface 13C. Then, the central conductor 18 extends toward the rear of the upper surface 13C and extends onto the rear main surface 13B. The central conductor 18 extends downward on the rear main surface 13B while crossing the central conductor 17 and then extends onto the lower surface 13D. The central conductor 18 extends forward on the lower surface 13D and then extends onto the front main surface 13A. In this way, the central conductor 18 is wound through a first turn around the soft magnetic material core 16 and thereafter is similarly wound through a second turn, a third turn and a fourth turn around the soft magnetic material core 16. An end of the fourth turn of the central conductor 18 is connected to the connection electrode 19C provided on the lower surface 13D. An end of the first turn of the central conductor 18 is connected to the connection electrode 19A provided on the lower surface 13D. The connection electrode 19A defines and functions as the common input port P11 at which an end of the central conductor 17 and an end of the central conductor 18 are connected to each other and that connects the central conductor 17 and the central conductor 18 to the external connection terminal IN.

In the central-conductor-defining portion 13, the central conductor 17 and the central conductor 18 cross each other while being insulated from each other on the surfaces of the soft magnetic material core 16 and magnetic flux is perpendicularly or substantially perpendicularly applied from the permanent magnets 11 and 12 to this portion where the central conductors 17 and 18 cross each other and therefore the central conductors 17 and 18 are coupled with each other via this magnetic field.

Figure 5A:
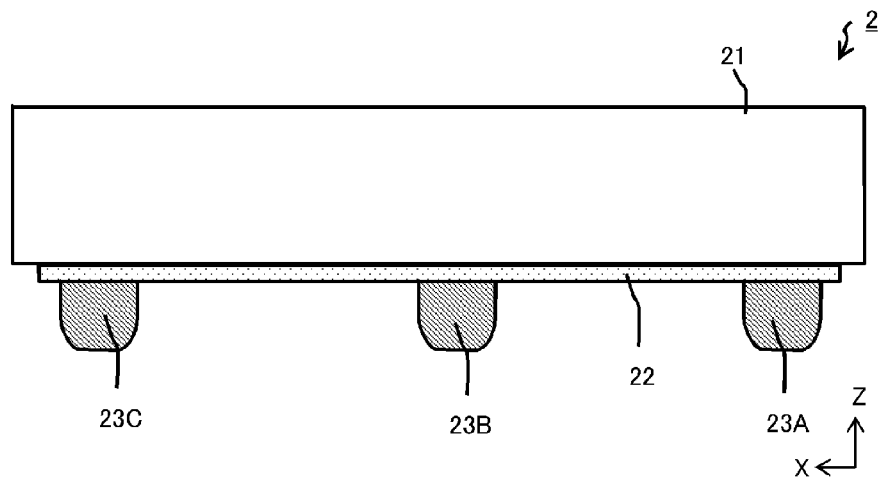
FIG. 5A is a perspective view and FIG. 5B is a plan view of a circuit-defining section according to a preferred embodiment of the present invention.
Figure 5B:
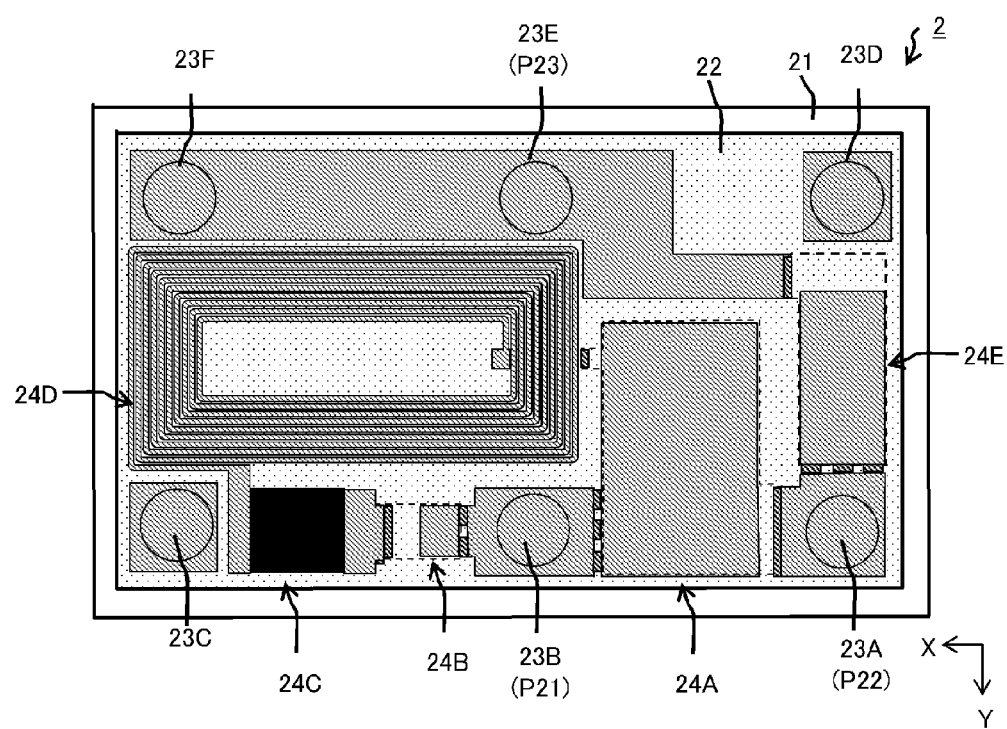

FIG. 5A is a side view of the circuit-defining section 2. FIG. 5B is a plan view seen from the lower surface side of the circuit-defining section 2.

The circuit-defining section 2 includes a support substrate 21, a semiconductor thin film 22, and terminal portions 23A, 23B, 23C, 23D, 23E and 23F.

The support substrate 21 preferably is a rectangular or substantially rectangular flat plate when viewed in plan, and, here, preferably is an insulator substrate having a high insulation resistance such as a glass substrate or a GaAs substrate in order to reduce the passage loss of signals in the circuit-defining section 2. The semiconductor thin film 22 is a thin film composed of a semiconductor such as Si and is joined to the lower surface of the support substrate 21. The terminal portions 23A, 23B, 23C, 23D, 23E and 23F are preferably bumps on the lower surface of the semiconductor thin film 22. As a result of connecting the circuit-defining section 2 to the main substrate 3 by providing the terminal portions 23A to 23F on the lower surface of the semiconductor thin film 22, the lengths of connection wiring lines that connect the circuit-defining section 2 to the main substrate 3 are able to be significantly reduced compared with a case where the terminal portions 23A to 23F are provided on the support substrate 21 side of the circuit-defining section 2. In addition, by providing the terminal portions 23A to 23F as bumps, the terminal portions 23A to 23F are able to have a very low profile and for this reason as well the length of connection wiring lines that connect the circuit-defining section 2 to the main substrate 3 are able to be significantly reduced.

The terminal portions 23A, 23B and 23C are provided in order along one of the opposing long edges of the lower surface of the semiconductor thin film 22. The terminal portions 23D, 23E and 23F are provided in order along the other one of the opposing long edges of the lower surface of the semiconductor thin film 22. The terminal portion 23B corresponds to the input port P21, the terminal portion 23A corresponds to the relay port P22 and the terminal portion 23E corresponds to the output port P23.

The semiconductor thin film 22 is provided with a first capacitor portion 24A, a second capacitor portion 24B, a resistor portion 24C, an inductor portion 24D and a third capacitor portion 24E provided on the lower surface thereof. The first capacitor portion 24A, the second capacitor portion 24B, the resistor portion 24C, the inductor portion 24D and the third capacitor portion 24E are preferably defined by high-precision micro-fabricated conductor patterns formed by using a semiconductor thin film process, and define impedance elements. Consequently, the conductor patterns, that is, the impedance elements, are able to be provided with high density on the semiconductor thin film 22, and the lengths of connection wiring lines that connect the impedance elements to each other in the circuit-defining section 2 are able to be significantly shortened. Furthermore, high form accuracy is realized for the conductor patterns and the values of the impedance elements are able to be set with high accuracy. The impedance elements may include conductor patterns that have been provided with conductivity by doping a semiconductor thin film with an impurity.

The first capacitor portion 24A defines the capacitor C1 illustrated in FIG. 1. The first capacitor portion 24A is defined by providing two planar conductors that face each other in a film thickness direction with an insulating film therebetween in a region interposed between the terminal portion 23B and the terminal portion 23A and is connected between the input port P21 and the relay port P22. Thus, by arranging the capacitor C1 between the input port P21 and the relay port P22, which are connected to the wiring portions 3A and 3B of the main substrate 3 and connecting the capacitor C1 to the central conductor 17 via the wiring portions 3A and 3B, the lengths of the connection wiring lines between these elements are able to be significantly shortened. Thus, parasitic components generated by the connection wiring lines between the capacitor C1 and the central conductor 17 are able to be made very small and narrowing of the isolation band due to parasitic inductances is effectively reduced or prevented.

The second capacitor portion 24B defines the capacitor C2 illustrated in FIG. 1. The second capacitor portion 24B is defined by providing two planar conductors that face each other in a film thickness direction with an insulating film therebetween in a region interposed between the terminal portion 23B and the terminal portion 23C and closer to the terminal portion 23B. One end of the second capacitor portion 24B is connected to a planar conductor that is connected to the terminal portion 23B of the input port P21.

The resistor portion 24C defines the resistor R illustrated in FIG. 1. The resistor portion 24C is defined by providing a resistor thin film in a region that is interposed between the terminal portion 23B and the terminal portion 23C and that is closer to the terminal portion 23C, and one end of the resistor portion 24C is connected to a planar conductor that is not connected to the terminal portion 23B of the second capacitor portion 24B.

The inductor portion 24D defines the inductor L3 illustrated in FIG. 1. The inductor portion 24D is defined by providing a line-shaped conductor that loops through a plurality of turns in a large-area region that is interposed between the terminal portion 23B, the terminal portion 23C, the terminal portion 23E and the terminal portion 23F, one end of the inductor portion 24D is connected to the resistor portion 24C and the other end of the inductor portion 24D is connected to a planar conductor that is connected to the terminal portion 23A (P22) side of the first capacitor portion 24A.

The third capacitor portion 24E defines the capacitor CS2 illustrated in FIG. 1. The third capacitor portion 24E is defined by providing two planar conductors that face each other in a film thickness direction with an insulating film therebetween in a region interposed between the terminal portion 23A and the terminal portion 23D and is connected between the relay port P22 and the output port P23.

By providing the plurality of impedance elements (capacitors C1, C2, CS2, resistor R and inductor L3) in an integrated manner in the circuit-defining section 2 in this way, mounting variations and mounting failures do not occur among the impedance elements, manufacturing errors in the impedance elements are able to be reduced or prevented and the accuracy of the values of the impedance elements is increased.

Here, an example of an isolator according to a preferred embodiment of the present invention (hereinafter referred to as "the example") and a comparative example of an isolator of the related art (hereinafter referred to as "the comparative example") will be described. FIG. 6A is a plan view of an isolator 10A according to the example and FIG. 6B is a plan view of an isolator 30 according to the comparative example.

The isolator 10A according to the example and the isolator 30 according to the comparative example have an equivalent circuit that is the same as the equivalent circuit illustrated in FIG. 1 and include a main substrate 3 and a core isolator 1 having substantially the same configurations as those illustrated in FIG. 2. However, instead of being provided with the circuit-defining section 2, the isolator 30 according to the comparative example is provided with a plurality of chip components that are individually mounted on the main substrate 3. The chip components individually define the circuit elements illustrated in FIG. 1, that is, the capacitor C1, the resistor R, the inductor L3, the capacitor C2 and the capacitor CS2. The capacitor C2 is a composite capacitor made up of a capacitor C2A and a capacitor C2B defined by individual chip components.

Comparing the isolator 10A according to the example and the isolator 30 according to the comparative example, a larger number of wiring patterns are required on the main substrate 3 of the isolator 30 according to the comparative example in order to connect the plurality of chip components to each other compared with on the main substrate 3 of the isolator 10A according to the example. Therefore, narrowing of the obtained bandwidth for isolation characteristics, an increase in passage loss and an increase in input impedance may occur due to parasitic components generated by the wiring patterns in the isolator 30 according to the comparative example.

In contrast, in the isolator 10A according to the example, since the plurality of impedance elements are arranged in the circuit-defining section 2, the number of components mounted on the main substrate 3 is greatly reduced (here, the number of components preferably is two, for example) and the surface area needed to mount the components 1 and 2 is reduced. Consequently, the main substrate 3 is able to have a small surface area and a small size. The connection wiring line lengths of the wiring portions 3A, 3B, 3C and 3D provided on the upper surface of the main substrate 3 are able to be significantly reduced and parasitic components defined by the connection wiring lines are able to be significantly reduced or prevented. In this way, passage loss of the isolator is significantly reduced or prevented by suppressing parasitic resistances and the input impedance is significantly reduced by suppressing parasitic inductances and parasitic capacitances.

Figure 7A:
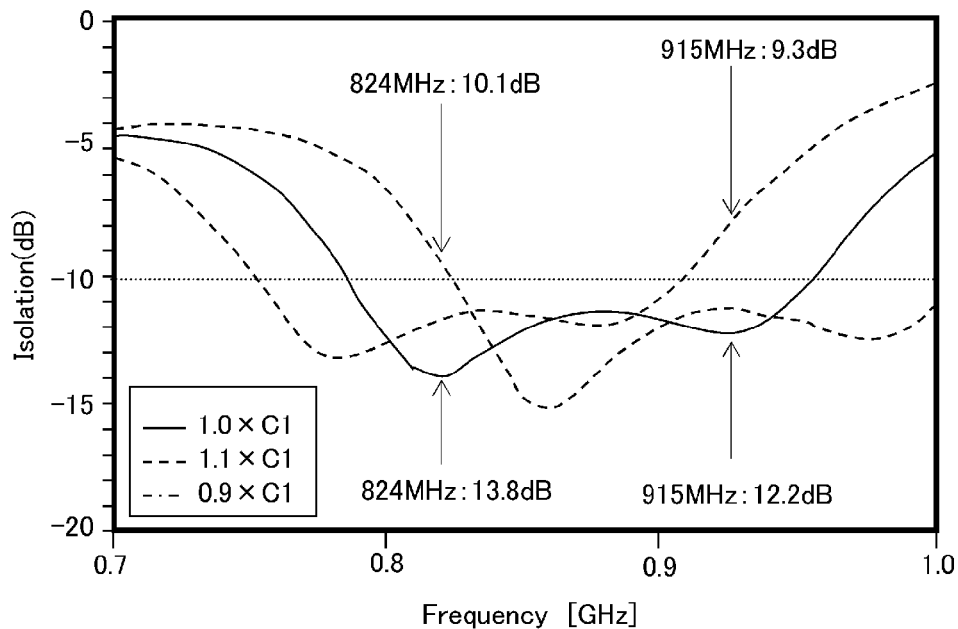
FIGS. 7A and 7B are graphs illustrating isolation characteristics of the isolators according to an example of a preferred embodiment of the present invention and a comparative example, respectively.
Figure 7B:
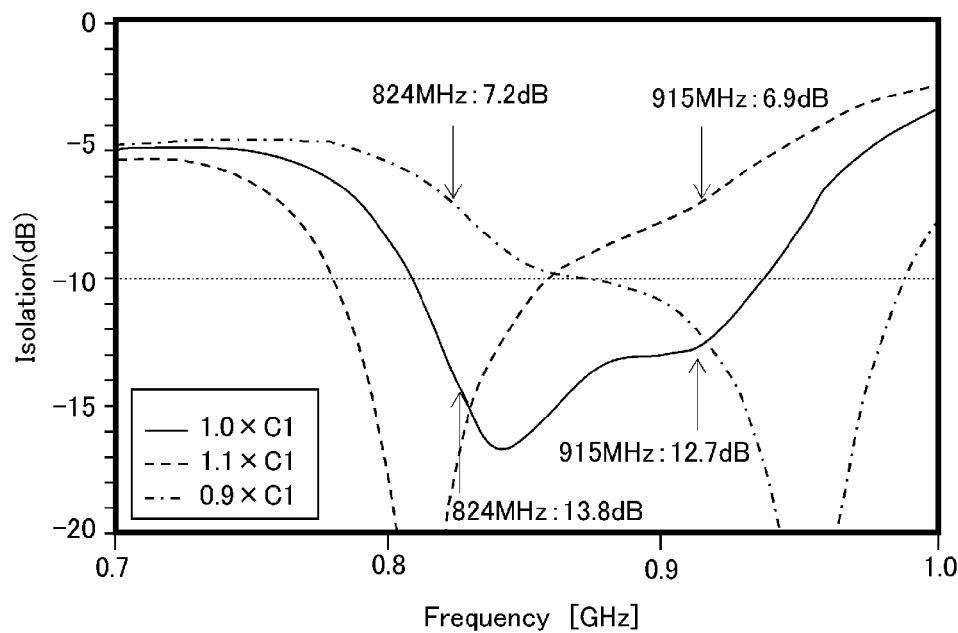

FIG. 7A is a graph illustrating isolation characteristics of the isolator 10A according to the example. FIG. 7B is a graph illustrating isolation characteristics of the isolator 30 according to the comparative example. Here, a case is exemplified in which the isolator 10A and the isolator 30 are used in a specific communication band (for example, 824 MHz to 915 MHz) used in communication using a cellular phone.

A state obtained by adjusting each impedance element of the isolator 10A such that the two peaks contained in the isolation band line up with a frequency of 824 MHz and a frequency of 915 MHz defines a setting reference state for the isolator 10A according to the example. In this setting reference state, as illustrated by the solid line in FIG. 7A, the isolation at the frequency of 824 MHz was about −13.8 dB, the isolation at the frequency of 915 MHz was about −12.2 dB and isolation that was better than about −10.0 dB was obtained over the entire frequency band from 824 MHz to 915 MHz, for example.

Then, the capacitance of the capacitor C1 was adjusted so as to be increased by about 10% from that in the setting reference state, and as a result the isolation band of the isolator 10A according to the example shifted by around several tens of MHz toward the low frequency side, as illustrated by the broken line in FIG. 7A. Thus, the isolation at the upper limit frequency of 915 MHz in the frequency band of 824 MHz to 915 MHz was degraded by a comparatively small amount from about −12.2 dB before the adjustment to about −9.3 dB, for example. In addition, the capacitance of the capacitor C1 was adjusted to be about 10% lower than that in the setting reference state, and as a result the isolation band of the isolator 10A according to the example shifted by around several tens of MHz toward the high frequency side, as illustrated by the single dot chain line in FIG. 7A. Thus, the isolation at the lower limit frequency of about 824 MHz in the frequency band of about 824 MHz to about 915 MHz was degraded by a comparatively small amount from about −13.8 dB before the adjustment to about −10.1 dB, for example.

In other words, with the isolator 10A according to the example, comparatively excellent isolation of about −10.0 dB is realized across the entire communication band by a plurality of isolators manufactured with the same specification even when the capacitances of capacitors C1 vary by about 10% due to the occurrence of manufacturing errors, for example. Therefore, the occurrence of a defect in which a large frequency shift occurs for the isolation band and the isolation band is shifted from the desired frequency band is significantly reduced or prevented.

In the isolator 10A according to the example, the capacitor C1 is integrated into the circuit-defining section 2 together with the other impedance elements and is defined by a semiconductor thin film process on the semiconductor thin film 22 in the circuit-defining section 2, and therefore manufacturing errors regarding the capacitance are reduced by about 10%, for example. Therefore, the isolation band of each of a plurality of isolators having the same specification as the isolator 10A according to the example does not greatly change from the isolation band in the setting reference.

On the other hand, a state obtained by adjusting each impedance element of the isolator 30 such that the isolation at the lower limit frequency of 824 MHz and at the upper limit frequency of 915 MHz of the frequency band of 824 MHz to 915 MHz matched the isolation in the setting reference state of the isolator 10A described above defines a setting reference state for the isolator 30 according to the comparative example. In this setting reference state, as illustrated by the solid line in FIG. 7B, the isolation at a frequency of 824 MHz was −13.8 dB, the isolation at a frequency of 915 MHz was −12.7 dB and isolation that was better than −10.0 dB was obtained over the entire frequency band from 824 MHz to 915 MHz.

Then, the capacitance of the capacitor C1 was adjusted so as to be increased by 10% from that in the setting reference, and as a result the upper limit frequency of the isolation band of the isolator 30 according to the comparative example shifted by around a hundred MHz toward the low frequency side, as illustrated by the broken line in FIG. 7B. Thus, the isolation at the upper limit frequency of 915 MHz in the frequency band of 824 MHz to 915 MHz was degraded by a large amount from −12.7 dB before the adjustment to −6.9 dB. In addition, the capacitance of the capacitor C1 was adjusted to be 10% lower than that in the setting reference, and as a result the lower limit frequency of the isolation band of the isolator 30 according to the comparative example shifted by around several tens of MHz toward the high frequency side, as illustrated by the single dot chain line in FIG. 7B. Thus, the isolation at the lower limit frequency of 824 MHz in the frequency band of 824 MHz to 915 MHz was degraded by a large amount from −13.8 dB before the adjustment to −7.2 dB.

Thus, in the isolator 30 according to the comparative example, it is clear that if a manufacturing error of around 10% occurs in regard to the capacitance of the capacitor C1, the frequency band where comparatively good isolation of about −10.0 dB can be commonly realized in a plurality of isolators 30 manufactured with the same specification will be very narrow.

Figure 8A:
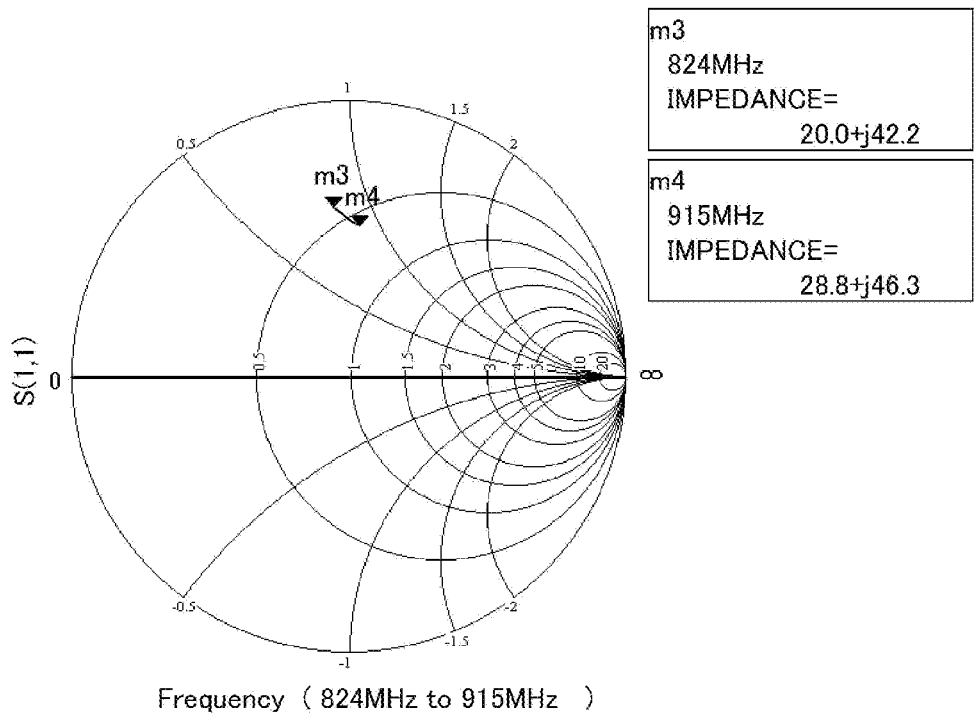
FIGS. 8A and 8B are plan views illustrating impedance charts of the isolators according to an example of a preferred embodiment of the present invention and a comparative example, for example.
Figure 8B:
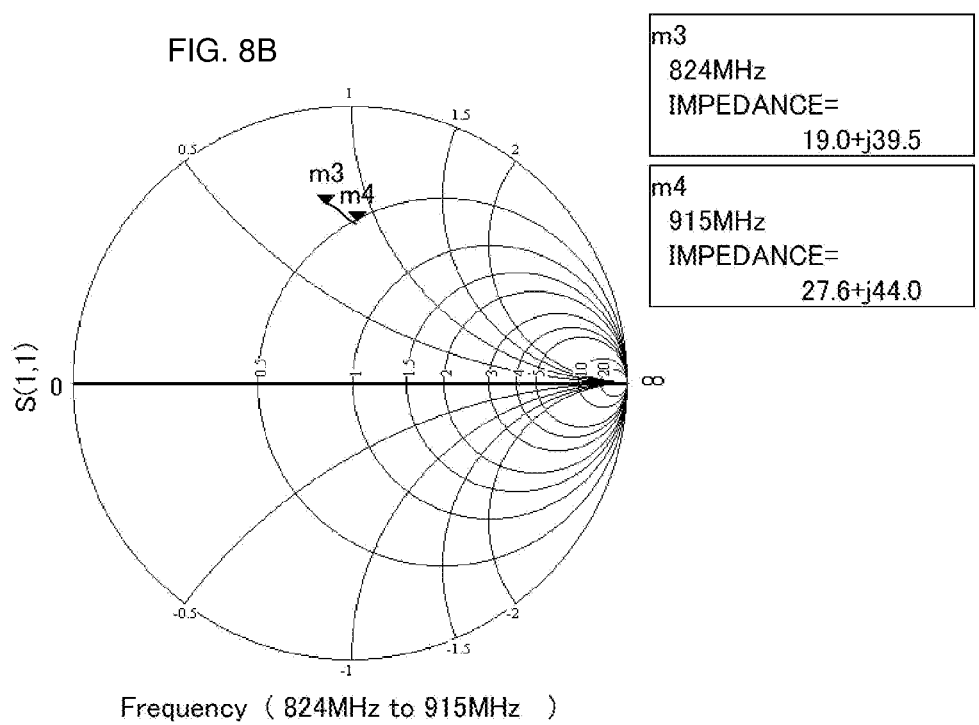

FIG. 8A is an impedance chart illustrating the input impedance of the isolator 10A according to the example. FIG. 8B is an impedance chart illustrating the input impedance of the isolator 30 according to the comparative example. Comparing the input impedance of the isolator 10A according to the example and the input impedance of the isolator 30 according to the comparative example, the real part of the input impedance of the isolator 10A according to the example is higher than the real part of the input impedance of the isolator 30 according to the comparative example even at the upper limit frequency of 915 MHz and the lower limit frequency of 824 MHz of the frequency band of 824 MHz to 915 MHz.

Therefore, it is clear that by providing the impedance elements in the circuit-defining section 2 in order to shorten the connection wiring lines between the impedance elements as in the isolator 10A according to the example, parasitic components are significantly reduced or prevented and as a result, the input impedance of the isolator 10A is decreased. As a consequence of the input impedance of the isolator 10A decreasing, it is possible to set the input impedance of a matching circuit connected to the external connection terminal IN to a lower value. Thus, matching loss that occurs between the matching circuit connected to the external connection terminal IN and the transmission power amplifier PA is significantly reduced.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An isolator comprising:
  a core isolator that includes a permanent magnet, a magnetic core to which a direct-current magnetic field is applied from the permanent magnet, and a first central conductor and a second central conductor that oppose each other and are insulated from each other on a surface of the magnetic core;
  a main substrate that includes an input wiring portion, an output wiring portion and a ground wiring portion, and has the core isolator mounted thereon, one end of the first central conductor and one end of the second central conductor being connected to the input wiring portion, another end of the first central conductor being connected to the output wiring portion and another end of the second central conductor being connected to the ground wiring portion; and a circuit-defining section in which a conductor pattern is provided that includes a capacitor that is connected in parallel with the first central conductor via the input wiring portion and the output wiring portion, and an impedance element that is connected to at least one of the input wiring portion and the output wiring portion.

2. The isolator according to claim 1, wherein the permanent magnet includes at least two permanent magnets arranged to apply a magnetostatic field.

3. The isolator according to claim 1, further comprising connection electrodes and dummy electrodes that define a central-conductor-defining portion with the magnetic core and the first and second central conductors.

4. The isolator according to claim 1, wherein the magnetic core includes a plurality of recesses located at regular intervals.

5. The isolator according to claim 1, wherein the impedance element includes at least one of a capacitor portion, a resistor portion and an inductor portion.

6. The isolator according to claim 1, wherein the circuit-defining section includes an input port, a relay port, and an output port.

7. The isolator according to claim 6, wherein the capacitor is provided between the input port and the relay port and is connected in parallel with the first central conductor.

8. The isolator according to claim 1, wherein the circuit-defining section includes a plurality of capacitors, a resistor and an inductor.

9. The isolator according to claim 8, wherein one of the capacitors, the resistor and the inductor are connected in series with each other.

10. The isolator according to claim 1, further comprising a dielectric sheet and a flat-plate yoke joined to an upper surface of the core isolator via the dielectric sheet.

11. The isolator according to claim 10, wherein the dielectric sheet is an adhesive sheet.

12. A transmission circuit including the isolator according to claim 1.

13. A cellular phone comprising the transmission circuit according to claim 12.

14. The isolator according to claim 1, wherein the circuit-defining section includes a semiconductor thin film on a surface on which the conductor pattern is provided.

15. The isolator according to claim 14, wherein the semiconductor thin film includes first, second and third capacitor portions, a resistor portion, and an inductor portion.

16. The isolator according to claim 14, wherein the circuit-defining section further includes a support substrate on which the semiconductor thin film is provided and bumps that are provided on the semiconductor thin film and connect the conductor pattern to the input wiring portion and the output wiring portion.

17. The isolator according to claim 16, wherein the support substrate is an insulator substrate.

18. The isolator according to claim 16, wherein the circuit-defining section is arranged such that a bump that is connected to the input wiring portion and a bump that is connected to the output wiring portion are adjacent to each other and the conductor pattern that defines the capacitor is arranged between the bumps.

* * * * *